(12) United States Patent
Kim

(10) Patent No.: US 9,076,748 B2
(45) Date of Patent: Jul. 7, 2015

(54) THIN FILM TRANSISTOR SUBSTRATE AND METHOD OF REPAIRING SIGNAL LINE OF THE SUBSTRATE

(71) Applicant: SAMSUNG DISPLAY CO., LTD., Yongin, Gyeonggi-Do (KR)

(72) Inventor: Hyun-Tae Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/199,971

(22) Filed: Mar. 6, 2014

(65) Prior Publication Data

US 2015/0108482 A1 Apr. 23, 2015

(30) Foreign Application Priority Data

Oct. 18, 2013 (KR) .................. 10-2013-0124926

(51) Int. Cl.
*H01L 27/32* (2006.01)

(52) U.S. Cl.
CPC ........ *H01L 27/3276* (2013.01); *H01L 27/3248* (2013.01); *H01L 27/3297* (2013.01)

(58) Field of Classification Search
CPC ............ H01L 27/3265; H01L 27/3276; H01L 27/3297; H01L 27/3248
USPC ............... 257/71, 210, 296, 532, E23.013
See application file for complete search history.

(56) References Cited

U.S. PATENT DOCUMENTS

| | | | |
|---|---|---|---|
| 2005/0242743 A1* | 11/2005 | Kwak | 315/160 |
| 2005/0285989 A1* | 12/2005 | Sakurai et al. | 349/44 |
| 2007/0002246 A1 | 1/2007 | Chang et al. | |
| 2008/0217624 A1* | 9/2008 | Kwak et al. | 257/71 |
| 2010/0039016 A1* | 2/2010 | Lhee et al. | 313/307 |
| 2012/0146034 A1* | 6/2012 | Hong et al. | 257/59 |
| 2012/0175649 A1 | 7/2012 | Hong | |
| 2012/0326176 A1* | 12/2012 | Shirouzu et al. | 257/88 |
| 2013/0048990 A1* | 2/2013 | Park et al. | 257/59 |
| 2013/0155342 A1 | 6/2013 | Wu | |

FOREIGN PATENT DOCUMENTS

| | | |
|---|---|---|
| JP | 2006-11162 A | 1/2006 |
| KR | 10-2007-0003151 A | 1/2007 |
| KR | 10-2012-0081810 A | 7/2012 |
| KR | 10-2013-0042489 A | 4/2013 |

* cited by examiner

*Primary Examiner* — Allan R Wilson
(74) *Attorney, Agent, or Firm* — Christie, Parker & Hale LLP

(57) ABSTRACT

Disclosed are a thin film transistor substrate and a method of repairing a signal line of the thin film transistor substrate. The thin-film transistor substrate includes: a scan line for transferring a scan signal; a light-emission control line for transferring a light-emission control signal; and a capacitor including a first electrode and a second electrode, wherein the second electrode may be provided with a plurality of divided regions, al plurality of bridges coupling the plurality of divided regions to each other, and a plurality of protrusions which overlap at least one of the scan line and the light-emission control line.

20 Claims, 13 Drawing Sheets

THIN FILM TRANSISTOR SUBSTRATE AND METHOD OF REPAIRING SIGNAL LINE OF THE SUBSTRATE

CROSS-REFERENCE TO RELATED APPLICATION

This application claims priority to and the benefit of Korean Patent Application No. 10-2013-0124926, filed on Oct. 18, 2013, in the Korean Intellectual Property Office, the disclosure of which is incorporated herein in its entirety by reference.

BACKGROUND

1. Field

One or more embodiments of the present invention relate to a thin-film transistor substrate and a method of repairing a signal line of the substrate.

2. Description of the Related Art

A display apparatus is used to display images. In particular, an organic light-emitting display apparatus has recently been receiving attention. The organic light-emitting display apparatus includes a pixel circuit coupled to a plurality of signal lines arranged on a substrate and an organic light-emitting diode (OLED) coupled to the pixel circuit.

SUMMARY

One or more embodiments of the present invention include a thin-film transistor substrate which enables repairing of a signal line (e.g., a scan line, a light emission control line, etc.) under a spatial restriction of a high-resolution display apparatus and an organic light-emitting display apparatus including the same.

Additional aspects will be set forth in part in the description which follows and, in part, will be apparent from the description, or may be learned by practice of the presented embodiments.

According to one or more embodiments of the present invention, a thin-film transistor substrate includes: a scan line for transferring a scan signal; a light-emission control line for transferring a light-emission control signal; and a capacitor including a first electrode and a second electrode, wherein the second electrode includes a plurality of divided regions, a plurality of bridges for coupling the plurality of divided regions to each other, and a plurality of protrusions each overlapping at least one of the scan line or the light-emission control line.

The divided regions may include a first region, a second region which is adjacent to the scan line and is coupleable to the first region by a first bridge of the bridges, and a third region which is adjacent to the light-emission control line and is coupleable to the first region by a second bridge of the bridges.

When the scan line is open-circuited at an open circuit region of the scan line, the first bridge may be cut so that the second region is separated from the second electrode, and protrusions of the plurality of protrusions which overlap the scan line may be coupled to the scan line at a left side and a right side of an open circuit region.

When the light-emission control line is open-circuited at an open circuit region of the light emission control line, the second bridge may be cut so that the third region is separated from the second electrode, and protrusions of the plurality of protrusions which overlap the light-emission control line may be coupled to the light-emission control line at a left side and a right side of an open circuit region.

The second electrode may include a first connecting part adapted to couple the first region with a corresponding first region of a horizontally adjacent pixel, a second connecting part adapted to couple the second region with a corresponding second region of the horizontally adjacent pixel, and a third connecting part adapted to couple the third region with a corresponding third region of the horizontally adjacent pixel.

When the scan line is open-circuited at a open circuit region of the scan line, the first bridge and the first connecting part may be cut so that the second region is separated from the second electrode, and protrusions of the plurality of protrusions which overlap the scan line may be coupled to the scan line at a left side and a right side of an open circuit region.

When the light-emission control line is open-circuited at a open circuit region of the light-emission control line, the second bridge and the third connecting part may be cut so that the third region is separated from the second electrode, and protrusions of the plurality of protrusions which overlap the light-emission control line may be coupled to the light-emission control line at a left side and a right side of an open circuit region.

The scan line and the light-emission control line and the plurality of protrusions may be insulated by an insulating layer disposed therebetween.

Each of the plurality of divided regions may be coupled to a corresponding divided region of a horizontally adjacent pixel.

The second electrode may be coupled to a driving voltage line.

The driving voltage line may be shared by two adjacent pixels.

The thin-film transistor substrate may further include a driving thin-film transistor arranged to be perpendicular to the capacitor and including the first electrode as a gate electrode and a bent active layer.

According to one or more embodiments of the present invention, a thin-film transistor substrate includes: a signal line including an open circuit region; and a capacitor including a first electrode and a second electrode, wherein the second electrode includes a first region and a second region which is adjacent to the signal line and is coupleable to the first region by a first bridge, wherein the first bridge is cut so that the second region is separated from the second electrode, and protrusions of a plurality of protrusion of the second electrode which overlap the signal line are coupled to the signal line at a left side and a right side of the open circuit region.

The signal line may be a scan line for applying a scan signal or a light-emission control line for applying a light-emission control signal.

The first region may be coupled to a corresponding first region of a horizontally adjacent pixel.

The second electrode may be coupled to a driving voltage line.

The driving voltage line may be shared by two adjacent pixels.

The thin-film transistor substrate may further include a driving thin-film transistor arranged to be perpendicular to the capacitor and include the first electrode as a gate electrode and a bent active layer.

According to one or more embodiments of the present invention, a method of repairing an open-circuited signal line on a thin-film transistor substrate with a capacitor including a first electrode and a second electrode, the second electrode including a plurality of divided regions, a plurality of bridges coupling the plurality of divided regions to each other, and a plurality of protrusions which overlap signal lines includes: separating a first divided region of the divided regions from the second electrode by cutting a first bridge of the bridges, the first bridge coupling the first divided region, which is adjacent to the open-circuited signal line, to other ones of the divided regions; and coupling the open-circuited signal line to protrusions of the plurality of second which overlap the open-circuited signal line at a left side and a right side of an open circuit region of the open-circuited signal line.

BRIEF DESCRIPTION OF THE DRAWINGS

These and/or other embodiments will become apparent and more readily appreciated from the following description of the embodiments, taken in conjunction with the accompanying drawings in which.

DETAILED DESCRIPTION

Figure 1:
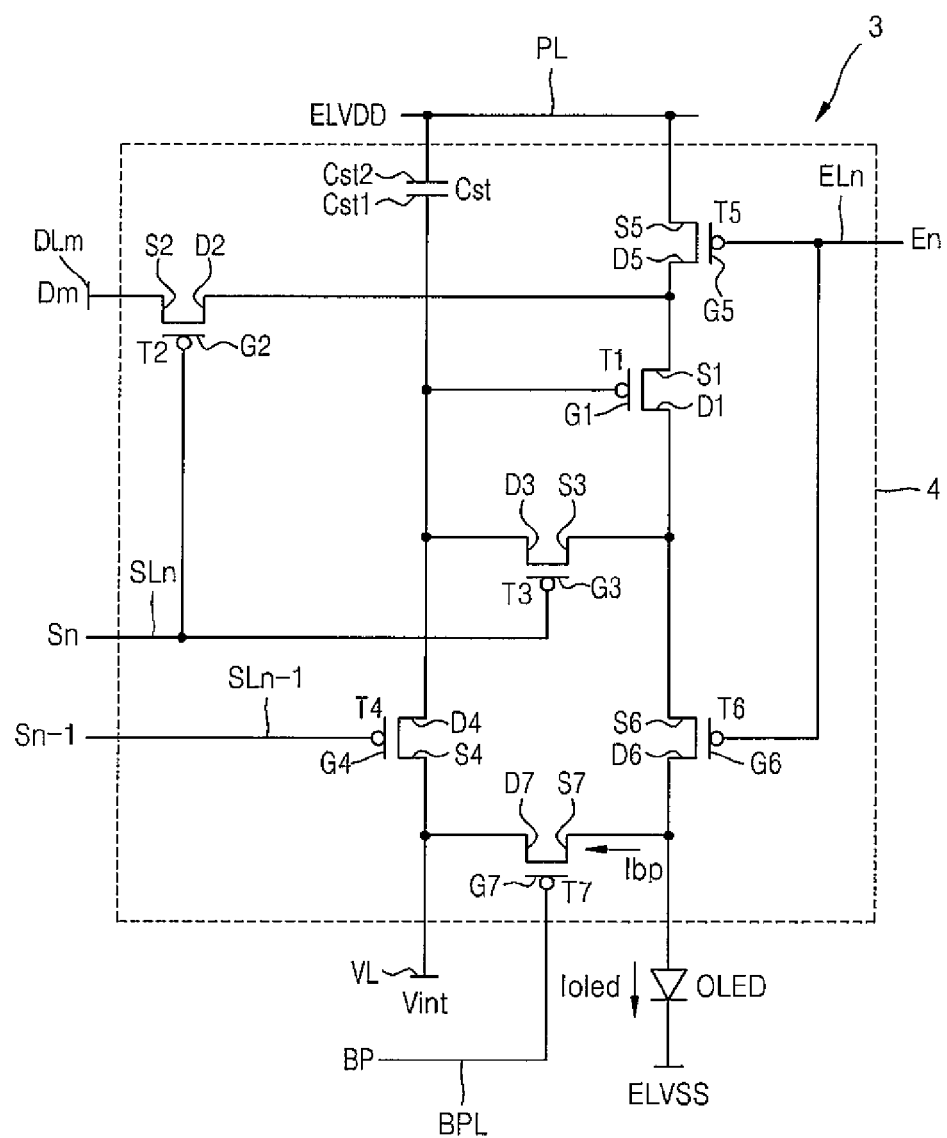
FIG. 1 is a circuit diagram illustrating an equivalent circuit of a pixel of an organic light-emitting display apparatus according to an embodiment of the present invention.

Reference will now be made in detail to embodiments of the present invention, examples of which are illustrated in the accompanying drawings, wherein like reference numerals refer to like elements throughout the accompanying drawings, and redundant descriptions may be omitted herein. In this regard, embodiments of the present invention may have different forms and should not be construed as being limited to the descriptions set forth herein or in the accompanying drawings. Accordingly, example embodiments of the present invention are described below, with reference to the figures, to explain certain embodiments of the present invention, which is not limited thereto.

It will be understood that although the terms "first", "second", etc. may be used herein to describe various components, these components should not be limited by these terms. These designations are only used to distinguish one component from another. As used herein, the singular forms "a," "an" and "the" are intended to also include the plural forms as well, unless the context clearly indicates otherwise.

It will be further understood that the terms "comprises," "comprising," "includes," and/or "including" as used herein specify the presence of stated features or components, but do not preclude the presence or addition of one or more other features or components.

It will be understood that when a layer, region, or component is referred to as being "formed on," another layer, region, or component, it may be directly or indirectly formed on the other layer, region, or component. That is, for example, intervening layers, regions, or components may also be present.

Sizes of elements in the drawings may be exaggerated for convenience of explanation. In other words, since sizes and thicknesses of components in the drawings are arbitrarily illustrated for convenience of explanation, the following embodiments are not limited thereto.

Expressions such as "at least one of," when preceding a list of elements, modify the entire list of elements and do not modify the individual elements of the list. Further, the use of "may" when describing embodiments of the present invention refers to "one or more embodiments of the present invention."

FIG. 1 is a circuit diagram illustrating an equivalent circuit of a pixel of an organic light-emitting display apparatus according to an embodiment of the present invention.

A pixel 3 of FIG. 1 is one of a plurality of pixels included in an nth-row line, and is coupled to a scan line SLn corresponding to the nth-row line and a scan line SLn−1 corresponding to an (n−1)th-row line. The pixel 3 according to an embodiment of the present invention is coupled to a scan line corresponding to a row line corresponding to the pixel 3 and to a scan line corresponding to a previous row line, but the pixel 3 is not limited thereto and may be coupled to any two (or more) scan lines from among a plurality of scan lines.

The pixel 3 of the organic light-emitting display apparatus according to an embodiment of the present invention includes a pixel circuit 4 including a plurality of thin-film transistors T1 to T7 and a capacitor Cst. The pixel 3 includes an organic light-emitting diode (OLED) coupled to the pixel circuit 4 to emit light.

The plurality of thin-film transistors includes a driving thin-film transistor T1, a switching thin-film transistor T2, a compensating thin-film transistor T3, an initializing thin-film transistor T4, a first light-emission control thin-film transistor T5, a second light-emission control thin-film transistor T6, and a bypass thin-film transistor T7.

The pixel 3 includes a first scan line SLn for transferring a first scan signal Sn to the switching thin-film transistor T2 and the compensating thin-film transistor T3, a second scan line SLn−1 for transferring a previous scan signal, i.e., a second scan signal Sn−1, to the initializing thin-film transistor T4, a light-emission control line ELn for transferring a light-emission control signal En to the first light-emission control thin-film transistor T5 and the second light-emission control thin-film transistor T6, a data line DLm crossing the first scan line SLn and transferring a data signal Dm, a driving voltage line PL arranged substantially in parallel with the data line DLm to transfer a first power supply voltage ELVDD, an initializing voltage line VL arranged substantially in parallel with the second scan line SLn−1 to transfer an initializing voltage Vint for initializing the driving thin-film transistor T1, and a bypass control line BPL for transferring a bypass signal BP to the bypass thin-film transistor T7.

A gate electrode G1 of the driving thin-film transistor T1 is coupled to a first electrode Cst1 of the capacitor Cst. A source electrode S1 of the driving thin-film transistor T1 is coupled to the driving voltage line PL via the first light-emission control thin-film transistor T5. A drain electrode D1 of the driving thin-film transistor T1 is electrically coupled to an anode of the OLED via the second light-emission control thin-film transistor T6. The driving thin-film transistor T1 receives the data signal Dm according to a switching operation of the switching thin-film transistor T2 and supplies a driving current Ioled to the OLED.

A gate electrode G2 of the switching thin-film transistor T2 is coupled to the first scan line SLn. A source electrode S2 of the switching thin-film transistor T2 is coupled to the data line DLm. A drain electrode D2 of the switching thin-film transistor T2 is coupled to the source electrode S1 of the driving thin-film transistor T1 and is also coupled to the driving voltage line PL via the first light-emission control thin-film transistor T5. The switching thin-film transistor T2 is turned on in response to the first scan signal Sn received through the first scan line SLn so as to transfer the data signal Dm, transferred to the data line DLm, to the source electrode S1 of the driving thin-film transistor T1.

A gate electrode G3 of the compensating thin-film transistor T3 is coupled to the first scan line SLn. A source electrode S3 of the compensating thin-film transistor T3 is coupled to the drain electrode D1 of the driving thin-film transistor T1 and is also coupled to the anode of the OLED via the second light-emission control thin-film transistor T6. A drain electrode D3 of the compensating thin-film transistor T3 is coupled to the first electrode Cst1 of the capacitor Cst, a drain electrode D4 of the initializing thin-film transistor T4, and the gate electrode G1 of the driving thin-film transistor T1. The compensating thin-film transistor T3 is turned on in response to the first scan signal Sn received through the first scan line SLn to couple the gate electrode G1 and the drain electrode D1 of the driving thin-film transistor T1 to each other so that the driving thin-film transistor T1 is diode-connected.

A gate electrode G4 of the initializing thin-film transistor T4 is coupled to the second scan line SLn−1. A source electrode S4 of the initializing thin-film transistor T4 is coupled to the initializing voltage line VL. The drain electrode D4 of the initializing thin-film transistor T4 is coupled to the first electrode Cst1 of the capacitor Cst, the drain electrode D3 of the compensating thin-film transistor T3, and the gate electrode GI of the driving thin-film transistor T1. The initializing thin-film transistor T4 is turned on in response to the second scan signal Sn−1 received through the second scan line SLn−1 to transfer the initializing voltage Vint to the gate electrode G1 of the driving thin-film transistor T1 so that a voltage of the gate electrode G1 of the driving thin-film transistor T1 is initialized.

A gate electrode G5 of the first light-emission control thin-film transistor T5 is coupled to the light-emission control line ELn. A source electrode S5 of the first light-emission control thin-film transistor T5 is coupled to the driving voltage line PL. A drain electrode D5 of the first light-emission control thin-film transistor T5 is coupled to the source electrode S1 of the driving thin-film transistor T1 and the drain electrode D2 of the switching thin-film transistor T2.

A gate electrode G6 of the second light-emission control thin-film transistor T6 is coupled to the light-emission control line ELn. A source electrode S6 of the second light-emission control thin-film transistor T6 is coupled to the drain electrode D1 of the driving thin-film transistor T1 and the source electrode S3 of the compensating thin-film transistor T3. A drain electrode D6 of the second light-emission control thin-film transistor T6 is electrically coupled to the anode of the OLED. The first light-emission control thin-film transistor T5 and the second light-emission control thin-film transistor T6 are concurrently (e.g., simultaneously) turned on in response to the light-emission control signal En received through the light-emission control line ELn so that the first power supply voltage ELVDD is transferred to the OLED and the driving current Ioled flows through the OLED.

A gate electrode G7 of the bypass thin-film transistor T7 is coupled to the bypass control line BPL, a source electrode S7 of the bypass thin-film transistor T7 is coupled to the drain electrode D6 of the second light-emission control thin-film transistor T6 and the anode of the OLED, and a drain electrode D7 of the bypass thin-film transistor T7 is coupled to the initializing voltage line VL and the source electrode S4 of the initializing thin-film transistor T4.

The bypass thin-film transistor T7 receives the bypass signal BP from the bypass control line BPL. The bypass signal BP has a certain level of voltage for constantly turning off the bypass thin-film transistor T7. The bypass thin-film transistor T7 receives the off-level voltage through the gate electrode G7 so that the bypass thin-film transistor T7 is constantly turned off, and a part of the driving current Ioled flows through the bypass thin-film transistor T7 as a bypass current Ibp while the bypass thin-film transistor T7 is turned off.

If the OLED emits light when a minimal current is supplied by the driving thin-film transistor T1 while displaying a black image, the black image is not properly displayed. However, the bypass thin-film transistor T7 of the organic light-emitting display apparatus according to an embodiment of the present invention may distribute a part of the minimal current, supplied by the driving thin-film transistor T1, as a bypass current Ibp to a current path (e.g., an electrical path) other than a current path (e.g., an electrical path) including the OLED. Here, the minimal current of the driving thin-film transistor T1 represents a current that flows through the driving thin-film transistor T1 when the driving thin-film transistor T1 is turned off since a gate-source voltage Vgs of the driving thin-film transistor T1 is smaller than a threshold voltage Vth. A minimal driving current (e.g., about 10 pA or less) is obtained when the condition for turning off the driving thin-film transistor T1 is satisfied and flows to the OLED so as to be expressed as the black image.

The effect of the bypass current Ibp may be great when the minimal driving current for displaying the black image flows, whereas the effect of the bypass current Ibp may be small when a large driving current for displaying a general image or a white image flows. Therefore, when the driving current flows to display the black image, the driving current Ioled of the OLED is reduced by as much as the bypass current Ibp that flows toward the bypass thin-film transistor T7, so that the driving current Ioled has a reduced current amount (e.g., lower than the minimal current) and more clearly expresses the black image. Therefore, a more correct black image may be obtained using the bypass thin-film transistor T7, thereby improving a contrast ratio.

A second electrode Cst2 of the capacitor Cst is coupled to the driving voltage line PL. The first electrode Cst1 of the capacitor Cst is coupled to the gate electrode G1 of the driving thin-film transistor T1, the drain electrode D3 of the compensating thin-film transistor T3, and the drain electrode D4 of the initializing thin-film transistor T4.

A cathode of the OLED is coupled to a second power supply voltage ELVSS. The OLED receives the driving current Ioled from the driving thin-film transistor T1 and emits light so that an image is displayed. The first power supply voltage ELVDD may have a high level, and the second power supply voltage ELVSS may be lower than the first power supply voltage ELVDD or may be a ground voltage.

Figure 2:
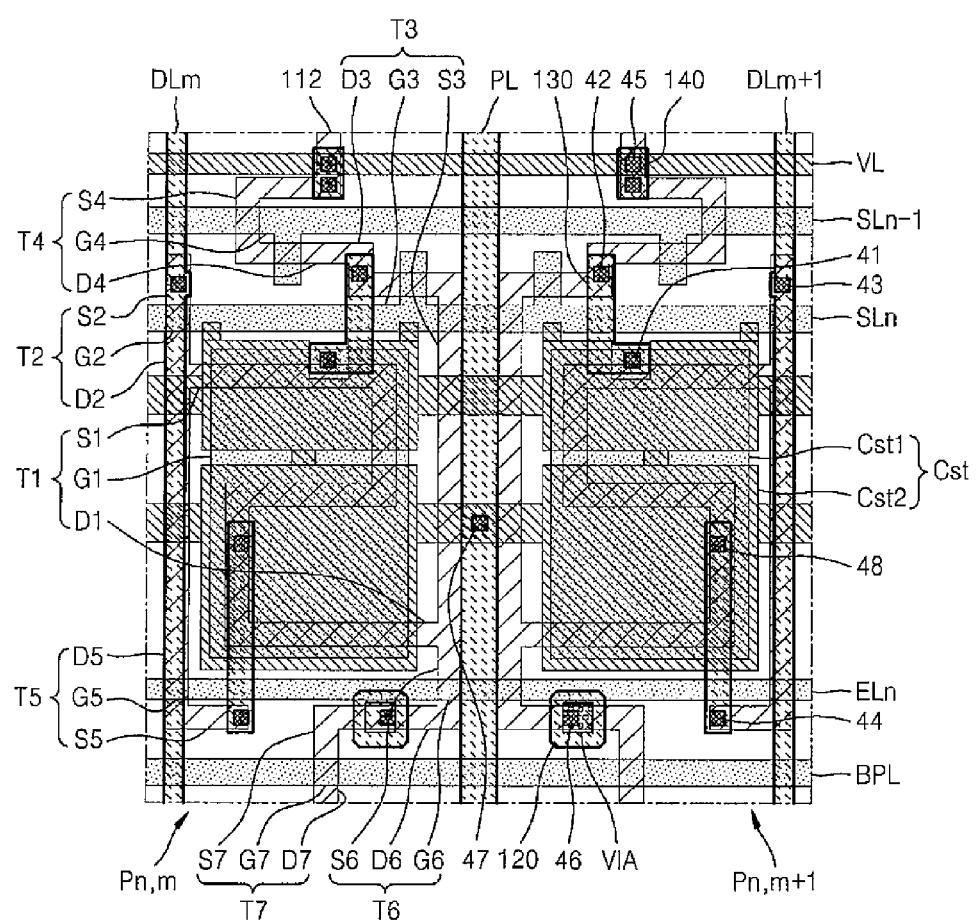
FIG. 2 is a planar view illustrating a thin-film transistor substrate provided with the pixel of FIG. 1.
Figure 3:
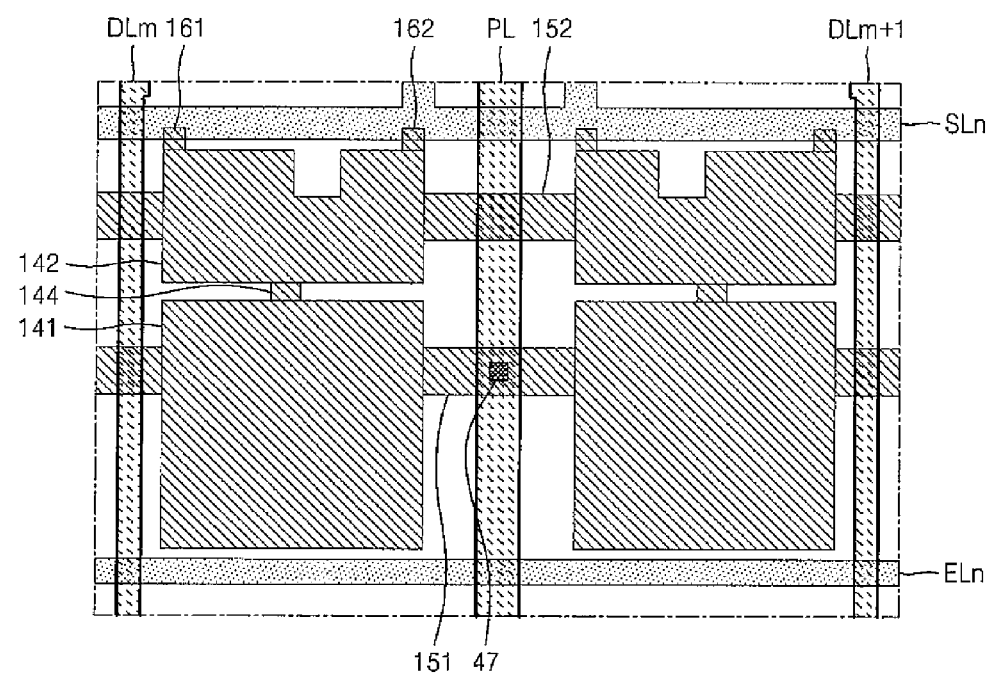
FIG. 3 is a diagram illustrating the second electrode of the capacitor of FIG. 2.

FIG. 2 is a planar view illustrating a thin-film transistor substrate provided with the pixel of FIG. 1. FIG. 3 is diagram illustrating the second electrode Cst2 of the capacitor Cst of FIG. 2. For convenience of explanation, FIG. 3 only illustrates the second electrode Cst2 of the capacitor Cst, the data lines DLm and DLm+1, and the driving voltage line PL.

As illustrated in FIG. 2, the thin-film transistor substrate of the organic light-emitting display apparatus according to an embodiment of the present invention includes the first scan line SLn, the second scan line SLn−1, the light-emission control line ELn, the initializing voltage line VL, and the bypass control line BPL which are arranged along a row direction and the lines respectively apply the first scan signal Sn, the second scan signal Sn−1, the light-emission control signal En, the initializing voltage Vint, and the bypass signal BP. The thin-film transistor substrate of the organic light-emitting display apparatus according to an embodiment of the present invention further includes the data line DLm (and/or DLm+1) and the driving voltage line PL which cross the first scan line SLn, the second scan line SLn−1, the light-emission control line ELn, the initializing voltage line VL, and the bypass control line BPL, and the lines respectively apply the data signal Dm (and/or Dm+1) and the first power supply voltage ELVDD to the pixel.

FIG. 2 illustrates two adjacent pixels, i.e., a first pixel Pn,m and a second pixel Pn,m+1. The first pixel Pn,m and the second pixel Pn,m+1 share the driving voltage line PL and are symmetrical to each other (e.g., they mirror each other) with respect to the driving voltage line PL.

The plurality of thin-film transistors T1 to T7 and the capacitor Cst are formed at each of the first pixel Pn,m and the second pixel Pn,m+1 on the thin-film transistor substrate according to an embodiment of the present invention. Furthermore, although not illustrated, the OLED may be formed at a region corresponding to a via hole VIA.

The plurality of thin-film transistors T1 to T7 are arranged along an active layer 112 which is bent and may have various forms. The active layer 112 is composed of polysilicon, and includes a channel region not doped with impurities and a source region and a drain region formed at both sides of the channel region and doped with impurities. Here, the impurities may be changed according to the types of the thin-film transistors, and may be N-type impurities or P-type impurities.

The driving thin-film transistor T1 includes the gate electrode G1, the source electrode Si, and the drain electrode D1. The source electrode S1 corresponds to the impurity-doped source region in the active layer, and the drain electrode D1 corresponds to the impurity-doped drain region in the active layer. The gate electrode G1 overlaps the channel region. The gate electrode G1 is coupled to the first electrode Cst1 of the capacitor Cst, the drain electrode D3 of the compensating thin-film transistor T3, and the drain electrode D4 of the initializing thin-film transistor T4 by a second connecting member 130 through contact holes 41 and 42. The active layer of the driving thin-film transistor T1 is bent. In the example illustrated in FIG. 2, the active layer of the driving thin-film transistor T1 is shaped '⇌,' like reversed 'S'.

By bending the active layer as described above, the active layer may extend long within a narrow space. Therefore, the channel region of the active layer of the driving thin-film transistor T1 may have a large length, and thus a driving range of a gate voltage applied to the gate electrode G1 may be wide. Therefore, due to the wide driving range of the gate voltage, a gradation of light emitted from the OLED may be more precisely realized and controlled. As a result, the resolution of the organic light-emitting display apparatus may be increased and the display quality thereof may be improved. The active layer of the driving thin-film transistor T1 may have various other forms such as, but not limited to, 'S', 'M', and 'W'.

The switching thin-film transistor T2 includes the gate electrode G2, the source electrode S2, and the drain electrode D2. The source electrode S2 corresponds to the impurity-doped source region in the active layer, and the drain electrode D2 corresponds to the impurity-doped drain region in the active layer. The gate electrode G2 overlaps the channel region. The source electrode S2 is coupled to the data line DLm through a contact hole 43. The drain electrode D2 is coupled to the source electrode S1 of the driving thin-film transistor T1 and the drain electrode D5 of the first light-emission control thin-film transistor T5. The gate electrode G2 is formed by a part of the first scan line SLn.

The compensating thin-film transistor T3 includes the gate electrode G3, the source electrode S3, and the drain electrode D3. The source electrode S3 corresponds to the impurity-doped source region in the active layer, and the drain electrode D3 corresponds to the impurity-doped drain region in the active layer. The gate electrode G3 overlaps the channel region and is formed by a part of the first scan line SLn.

The initializing thin-film transistor T4 includes the gate electrode G4, the source electrode S4, and the drain electrode D4. The source electrode S4 corresponds to the impurity-doped source region in the active layer, and the drain electrode D4 corresponds to the impurity-doped drain region in the active layer. The source electrode S4 may be coupled to the initializing voltage line VL by a third connecting member 140 through a contact hole 45. The gate electrode G4 overlaps the channel region. The gate electrode G4 is formed as a dual gate electrode by a part of the second scan line SLn−1 to prevent leakage current.

The first light-emission thin-film transistor T5 includes the gate electrode G5, the source electrode S5, and the drain electrode D5. The source electrode S5 corresponds to the impurity-doped source region in the active layer, and the drain electrode D5 corresponds to the impurity-doped drain region in the active layer. The gate electrode G5 overlaps the channel region. The source electrode S5 may be coupled to the driving voltage line PL through contact holes 44 and 48. The gate electrode G5 is formed by a part of the light-emission control line ELn.

The second light-emission thin-film transistor T6 includes the gate electrode G6, the source electrode S6, and the drain electrode D6. The source electrode S6 corresponds to the impurity-doped source region in the active layer, and the drain electrode D6 corresponds to the impurity-doped drain region in the active layer. The gate electrode G6 overlaps the channel region. The drain electrode D6 is coupled to a first connecting member 120 through a contact hole 46 and is coupled to the anode of the OLED through the via hole VIA. The gate electrode G6 is formed by a part of the light-emission control line ELn.

The bypass thin-film transistor T7 includes the gate electrode G7, the source electrode S7, and the drain electrode D7. The source electrode S7 corresponds to the impurity-doped source region in the active layer, and the drain electrode D7 corresponds to the impurity-doped drain region in the active layer. The gate electrode G7 is coupled to the bypass control line BPL. The gate electrode G7 overlaps the channel region. The source electrode S7 is directly coupled to the drain electrode D6 of the second light-emission control thin-film transistor T6. The drain electrode D7 is directly coupled to the drain electrode D4 of the initializing thin-film transistor T4.

The first electrode Cst1 of the capacitor Cst is coupled to the drain electrode D3 of the compensating thin-film transistor T3 and the drain electrode D4 of the initializing thin-film transistor T4 by the connecting member 130 coupled to the contact hole 41. The first electrode Cst1 of the capacitor Cst also serves as the gate electrode G1 of the driving thin-film transistor T1. The second electrode Cst2 of the capacitor Cst is coupled to the driving voltage line PL through a contact hole 47 so as to be provided with the first power supply voltage ELVDD from the driving voltage line PL.

The first electrode Cst1 is separated from an adjacent pixel and has a quadrilateral shape. The first electrode Cst1 is formed at the same layer as the first scan line SLn, the second scan line SLn−1, the light-emission control line ELn, and the gate electrodes G1 to G7 of the thin-film transistors T1 to T7 by using the same material as that for forming the first scan line SLn, the second scan line SLn−1, the light-emission control line ELn, and the gate electrodes G1 to G7 of the thin-film transistors T1 to T7.

The second electrode Cst2 of the capacitor Cst is coupled to an adjacent pixel, and is formed at the same layer as the initializing voltage line VL by using the same material as that for forming the initializing voltage line VL. The second electrode Cst2 of the capacitor Cst overlaps the entirety of the first electrode Cst1, and vertically overlaps the driving thin-film transistor T1. The capacitor Cst overlaps the active layer of the driving thin-film transistor T1 in order to secure a region of the capacitor Cst which is reduced by the bent active layer of the driving thin-film transistor T1. Therefore, capacitance may be secured while obtaining high resolution.

Referring to FIG. 3, the second electrode Cst2 of the capacitor Cst is provided with a first region 141 and a second region 142 which are separate regions having separate areas, a first bridge 144 coupling the first region 141 and the second region 142, and a first protrusion 161 and a second protrusion 162 overlapping the first scan line SLn.

The first regions 141 of adjacent pixels are coupled to each other by a first connecting part 151. The second regions 142 of the adjacent pixels are coupled to each other by a second connecting part 152.

The second capacitor Cst2 of the capacitor Cst may be coupled to the driving voltage line PL extended vertically by the contact hole 47. For example, the first connecting part 151 of the second electrode Cst2 of the capacitor Cst may be coupled to the driving voltage line PL through the contact hole 47. Accordingly, the driving voltage line PL may have a mesh structure vertically and horizontally interconnected using the second electrode Cst2 of the capacitor Cst. The second electrode Cst2 of the capacitor Cst may be used to repair an open circuit of the first scan line SLn.

The data line DLm (and/or DLm+1) is vertically (or longitudinally) arranged at a left or right side of a pixel. The data line DLm is coupled to the switching thin-film transistor T2 through the contact hole 43.

The driving voltage line PL is vertically arranged to be parallel with the data line DLm between the adjacent first and second pixels Pn,m and Pn,m+1. The driving voltage line PL is shared by the adjacent first and second pixels Pn,m and Pn,m+1. The driving voltage line PL is coupled to the second electrode Cst2 of the capacitor Cst by the contact hole 47.

Figure 4:
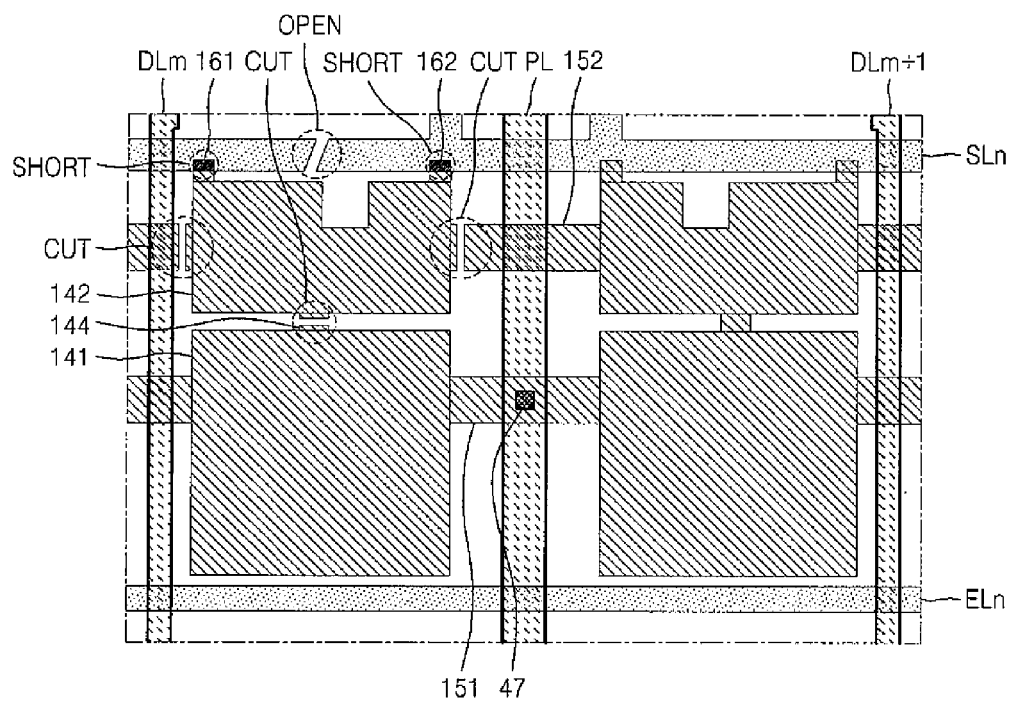
FIG. 4 is a schematic diagram illustrating a method of repairing a disconnected scan line on the thin-film transistor substrate of FIG. 2.

FIG. 4 is a schematic diagram illustrating a method of repairing an open-circuited scan line on the thin-film transistor substrate of FIG. 2.

FIG. 4 only illustrates the second electrode Cst2 of the capacitor Cst, the data lines DLm and DLm+1, and the driving voltage line PL for convenience of explanation.

As illustrated in FIG. 4, when the first scan line SLn arranged in the first pixel Pn,m is open-circuited, the second region 142 of the second electrode Cst2 of the capacitor Cst adjacent to the first scan line SLn is separated from the second electrode Cst2, and the separated second region 142 is coupled to the first scan line SLn.

For example, the first bridge 144 coupling the second region 142 and the first region 141 of the second electrode Cst2 and the second connecting parts 152 coupled to the second regions 142 of pixels Pn,m−1 and Pn,m+1 that are horizontally adjacent to the first pixel Pn,m are cut by irradiating a laser thereto. Furthermore, a laser is irradiated to the first protrusion 161 and the second protrusion 162 of the second electrode Cst2 positioned at left and right sides of an open-circuit region of the first scan line SLn so that the first protrusion 161 and the second protrusion 162 are short-circuited and coupled to the first scan line SLn.

Accordingly, the second region 142 of the second electrode Cst2 of the capacitor Cst may serve as a path (e.g., an electrical path) through which the first scan line SLn transfers the first scan signal Sn normally. The first region 141 may serve as the second electrode Cst2 of the capacitor Cst and the driving voltage line PL for horizontally transferring the first power supply voltage ELVDD.

According to an embodiment of the present invention, the second electrode Cst2 may serve as both an electrode of the capacitor Cst and the driving voltage line PL, and may also serve as a repair line of the first scan line SLn when a defect such as, but not limited to, an open circuit occurs.

Figure 5:
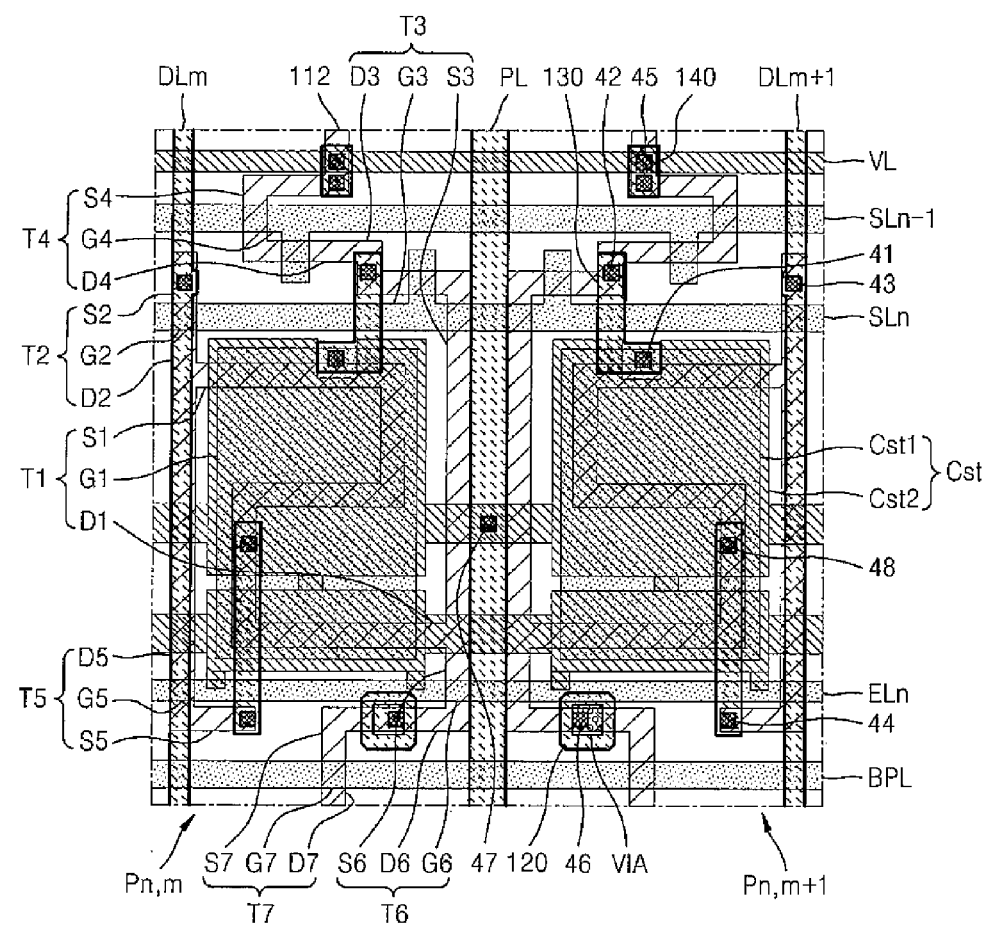
FIG. 5 is a planar view illustrating a thin-film transistor substrate provided with the pixel of FIG. 1.
Figure 6:
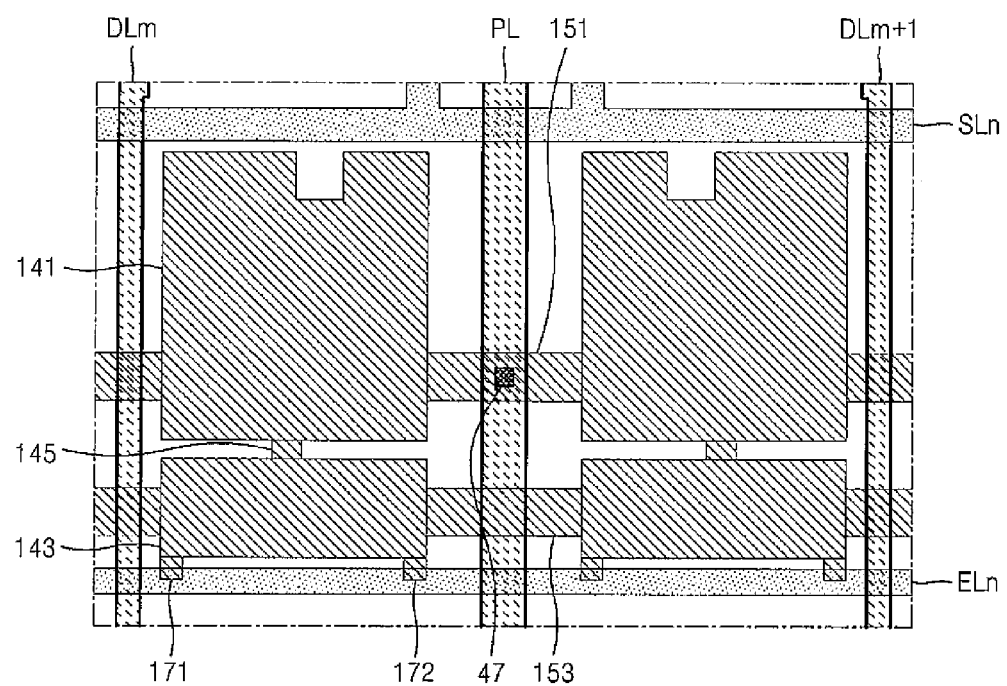
FIG. 6 is a diagram illustrating the second electrode of the capacitor of FIG. 5.

FIG. 5 is a planar view illustrating a thin-film transistor substrate provided with the pixel of FIG. 1. FIG. 6 is diagram illustrating the second electrode Cst2 of the capacitor Cst of FIG. 5. FIG. 6 only illustrates the second electrode Cst2 of the capacitor Cst, the data lines DLm and DLm+1, and the driving voltage line PL for convenience of explanation.

The example illustrated in FIG. 5 is different from the example illustrated in FIG. 2 with respect to the second electrode Cst2 of the capacitor Cst, but the other elements are the same. Hereinafter descriptions of the same elements as those of FIG. 2 will be omitted.

Referring to FIGS. 5 and 6, the second electrode Cst2 of the capacitor Cst is provided with the first region 141 and the third region 143 which are separate regions having separate areas, a second bridge 145 coupling the first region 141 and the third region 143, and a third protrusion 171 and a fourth protrusion 172 overlapping the light-emission control line ELn.

The first regions 141 of adjacent pixels are coupled to each other by the first connecting part 151. The third regions 143 of the adjacent pixels are coupled to each other by a third connecting part 153.

The second capacitor Cst2 of the capacitor Cst may be coupled to the driving voltage line PL extended vertically by the contact hole 47. For example, the first connecting part 151 of the second electrode Cst2 of the capacitor Cst may be coupled to the driving voltage line PL through the contact hole 47. Accordingly, the driving voltage line PL may have a mesh structure vertically and horizontally interconnected using the second electrode Cst2 of the capacitor Cst. The second electrode Cst2 of the capacitor Cst may be used to repair an open circuit of the light-emission control line ELn.

Figure 7:
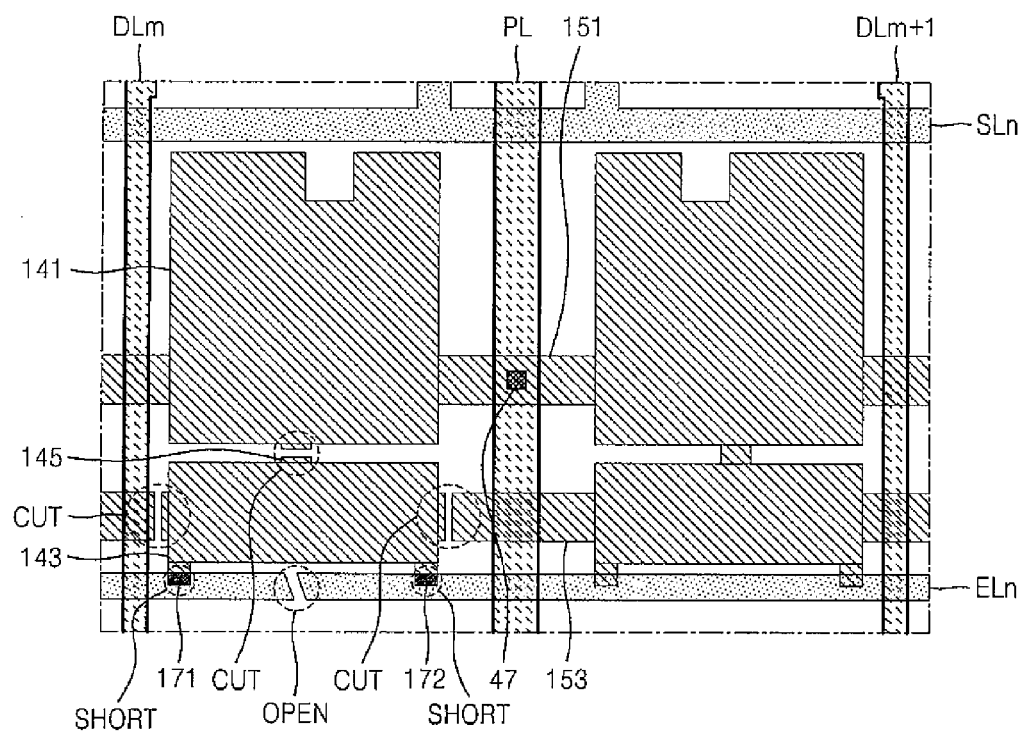
FIG. 7 is a schematic diagram illustrating a method of repairing an open-circuited light-emission control line on the thin-film transistor substrate of FIG. 5.

FIG. 7 is a schematic diagram illustrating a method of repairing an open-circuited light-emission control line on the thin-film transistor substrate of FIG. 5.

FIG. 7 only illustrates the second electrode Cst2 of the capacitor Cst, the data lines DLm and DLm+1, and the driving voltage line PL for convenience of explanation.

As illustrated in FIG. 7, when the light-emission control line ELn arranged in the first pixel Pn,m is open-circuited, the third region 143 of the second electrode Cst2 of the capacitor Cst adjacent to the light-emission control line ELn is separated from the second electrode Cst2, and the separated third region 143 is coupled to the light-emission control line ELn.

For example, the second bridge 145 coupling the third region 143 and the first region 141 of the second electrode Cst2 and the third connecting parts 153 coupled to the third regions 143 of the pixels Pn,m−1 and Pn,m+1 that are horizontally adjacent to the first pixel Pn,m are cut by irradiating a laser thereto. Furthermore, a laser is irradiated to the third protrusion 171 and the fourth protrusion 172 of the second electrode Cst2 positioned at left and right sides of an open-circuit region of the light-emission control line ELn so that the third protrusion 171 and the fourth protrusion 172 are short-circuited and coupled to the light-emission control line ELn.

Accordingly, the third region 143 of the second electrode Cst2 of the capacitor Cst may serve as a path (e.g., an electrical path) through which the light-emission control line ELn transfers the light-emission control signal En normally. The first region 141 may serve as the second electrode Cst2 of the capacitor Cst and the driving voltage line PL for horizontally transferring the first power supply voltage ELVDD.

According to an embodiment of the present invention, the second electrode Cst2 may serve as both an electrode of the capacitor Cst and the driving voltage line PL, and may also serve as a repair line of the light-emission control line ELn when a defect such as, but not limited to, an open circuit occurs.

Figure 8:
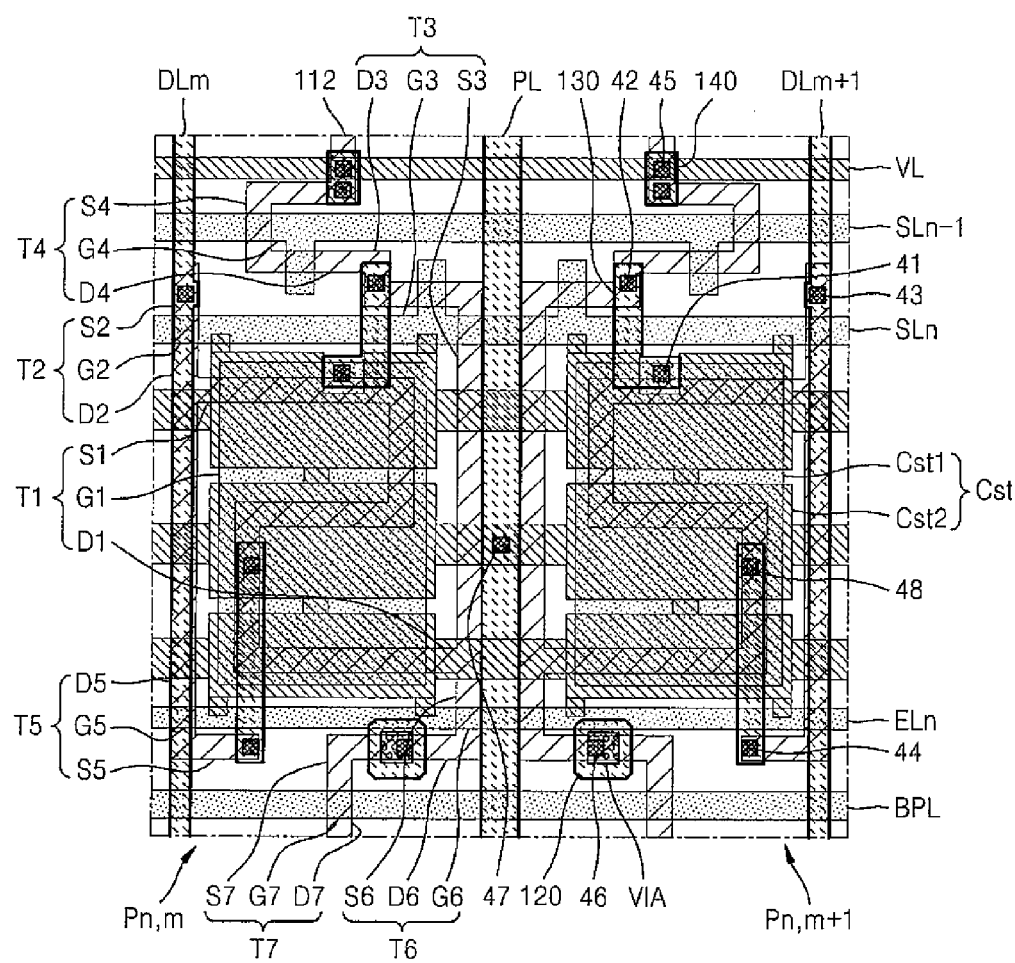
FIG. 8 is a planar view illustrating a thin-film transistor substrate provided with the pixel of FIG. 1.
Figure 9:
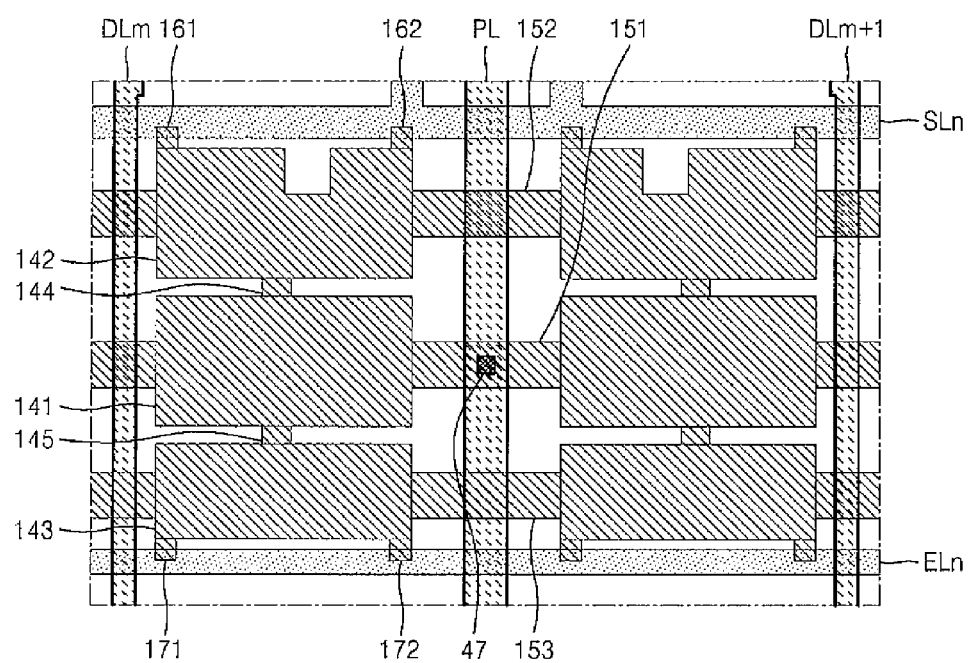
FIG. 9 is a diagram illustrating the second electrode of the capacitor of FIG. 8.

FIG. 8 is a planar view illustrating a thin-film transistor substrate provided with the pixel of FIG. 1. FIG. 9 is diagram illustrating the second electrode Cst2 of the capacitor Cst of FIG. 8. FIG. 9 only illustrates the second electrode Cst2 of the capacitor Cst, the data lines DLm and DLm+1, and the driving voltage line PL for convenience of explanation.

The example illustrated in FIG. 8 is different from the example illustrated in FIG. 2 with respect to the second electrode Cst2 of the capacitor Cst, but the other elements are the same. Hereinafter descriptions of the same elements as those of FIG. 2 will be omitted.

Referring to FIGS. 8 and 9, the second electrode Cst2 of the capacitor Cst is provided with the plurality of regions 141 to 143 which are separate regions having separate areas, the plurality of bridges 144 and 145 coupling the plurality of regions 141 to 143, and the plurality of protrusions 161, 162, 171, and 172 overlapping the first scan line SLn and the light-emission control line ELn.

The plurality of regions include the first region 141 arranged at the center, the second region 142 adjacent to the first scan line SLn, and the third region 143 adjacent to the light-emission control line ELn. The plurality of bridges include the first bridge 144 coupling the first region 141 and the second region 142 and the second bridge 145 coupling the first region 141 and the third region 143. The plurality of protrusions include the first and second protrusions 161 and 162 overlapping the first scan line SLn and the third and fourth protrusions 171 and 171 overlapping the light-emission control line ELn.

The first regions 141 of adjacent pixels are coupled to each other by the first connecting part 151. The second regions 142 of the adjacent pixels are coupled to each other by the second connecting part 152. The third regions 143 of the adjacent pixels are coupled to each other by the third connecting part 153.

The second capacitor Cst2 of the capacitor Cst may be coupled to the driving voltage line PL extended vertically by the contact hole 47. For example, the first connecting part 151 of the second electrode Cst2 of the capacitor Cst may be coupled to the driving voltage line PL through the contact hole 47. Accordingly, the driving voltage line PL may have a mesh structure vertically and horizontally interconnected using the second electrode Cst2 of the capacitor Cst. The second electrode Cst2 of the capacitor Cst may be used to repair short circuits of the first scan line SLn and/or the light-emission control line ELn.

Figure 10:
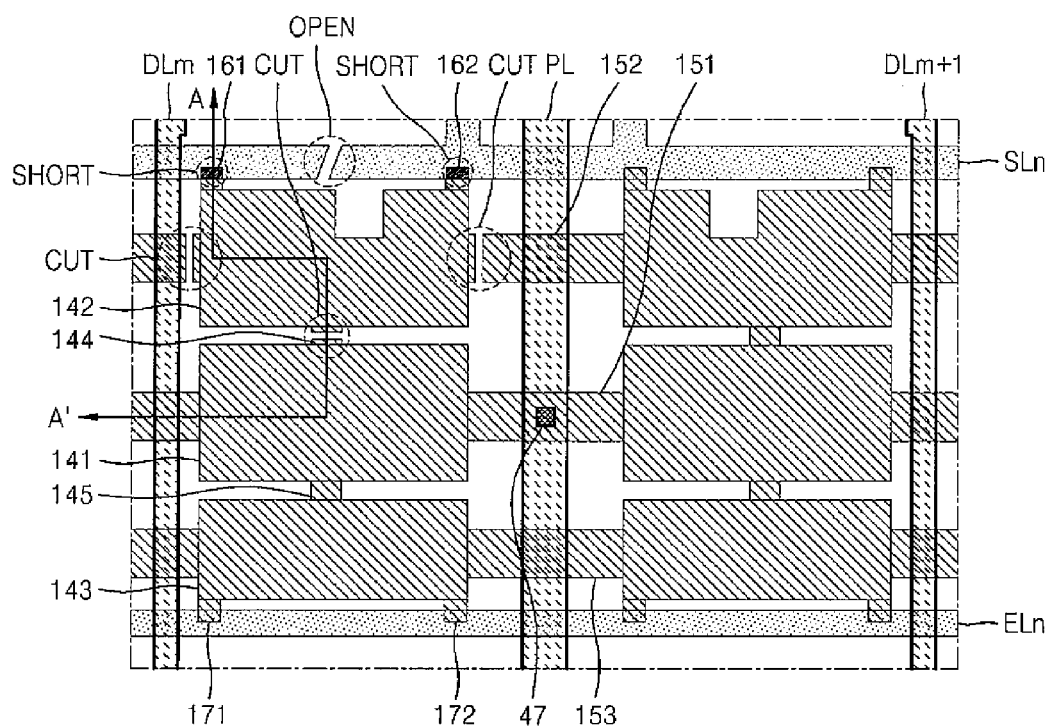
FIG. 10 is a schematic diagram illustrating a method of repairing an open-circuited scan line on the thin-film transistor substrate of FIG. 8.
Figure 11:
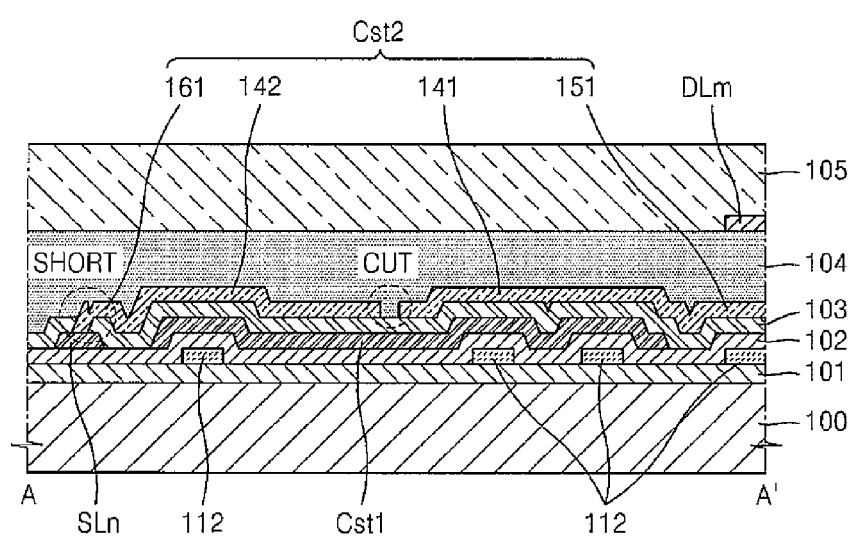
FIG. 11 is a cross-sectional view of the thin-film transistor substrate taken along the line A-A' of FIG. 10.

FIG. 10 is a schematic diagram illustrating a method of repairing an open-circuited scan line on the thin-film transistor substrate of FIG. 8. FIG. 11 is a cross-sectional view of the thin-film transistor substrate taken along the line A-A' of FIG. 10.

FIG. 10 only illustrates the second electrode Cst2 of the capacitor Cst for convenience of explanation, and FIG. 11 illustrates a cross section of the thin-film transistor substrate taken along the line A-A' of FIG. 10.

Referring to FIGS. 10 and 11, a buffer layer 101 is formed on a thin-film transistor substrate 100 (hereinafter referred to as a substrate). The substrate 100 may be formed of transparent glass mainly composed of $SiO_2$. The substrate 100 is not necessarily limited thereto, and may be formed of another material such as, but not limited to, transparent plastic or metal. Optionally, the buffer layer 101 may not be included.

The active layer 112 is formed on the buffer layer 101. The active layer 112 may include a semiconductor and may be formed of an oxide semiconductor. The active layer 112 is formed by depositing a semiconductor layer on the substrate 100 and by patterning and crystallizing the semiconductor layer according to an active layer pattern. Here, the semiconductor layer may be crystallized after being patterned, or may be patterned after being crystallized. The semiconductor layer may be crystallized using various methods such as, but not limited to, a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, and an advanced sequential lateral solidification (ASLS) method. A thin-film transistor is formed along the active layer 112.

A first insulating layer 102 is formed on the substrate 100 on which the active layer 112 is formed. The first insulating layer 102 may be formed of an organic insulating material or an inorganic insulating material or may have a multilayer structure in which the organic insulating material and the inorganic insulating material are alternated.

A first gate wiring including the gate electrode G1 of the driving thin-film transistor T1, the first electrode Cst1 of the capacitor Cst, and the first scan line SLn is formed on the first insulating layer 102. Although not illustrated, the gate electrodes G2 to G7 of the thin-film transistors T2 to T7, the second scan line SLn−1, the light-emission control line ELn, and the bypass control line BPL may be further included in the first gate wiring.

The first gate wiring may have a single-layer or multilayer structure including a metal material such as, but not limited to, platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), aluminum (Al), copper (Cu), or an alloy thereof.

The active layer 112 on the substrate 100 on which the first gate wiring is formed is doped with impurities so as to form a channel region not doped with the impurities and a source region and a drain region arranged at both sides of the channel region and doped with the impurities, in each active layer of the thin-film transistors T1 to T7. The source region and the drain region respectively correspond to a source electrode and a drain electrode. Here, the impurities may be changed according to the types of the thin-film transistors, and may be N-type impurities or P-type impurities. The doping may be performed after forming a second insulating layer 103.

FIG. 11 illustrates a part of the active layer 112 of the driving thin-film transistor T1.

The second insulating layer 103 is formed on the first gate wiring. The second insulating layer 103 may also serve as a dielectric of the capacitor Cst. The second insulating layer 103 may be formed of an organic insulating material or an inorganic insulating material or may have a multilayer structure in which the organic insulating material and the inorganic insulating material are alternated.

A second gate wiring including the second electrode Cst2 of the capacitor Cst is formed on the second insulating layer 103. The second gate wiring further includes the initializing voltage line VL. The second gate wiring may have a single-layer or multilayer structure including a metal material such as, but not limited to, platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), aluminum (Al), copper (Cu), or an alloy thereof.

A third insulating layer 104 is formed on the substrate 100 on which the second gate wiring is formed. The third insulating layer 104 may be formed of an organic insulating material or an inorganic insulating material or may have a multilayer structure in which the organic insulating material and the inorganic insulating material are alternated.

A data wiring including the data line DLm is formed on the substrate 100 on which the third insulating layer 104 is formed. The data wiring further includes the driving voltage line PL and the first to third connecting members 120, 130, and 140. The data wiring may have a single-layer or multilayer structure including a metal material such as, but not limited to, platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), aluminum (Al), copper (Cu), or an alloy thereof.

A protective layer 105 covering the data wiring is formed on the third insulating layer 104.

When the first scan line SLn arranged in the first pixel Pn,m is open-circuited, the second region 142 of the second electrode Cst2 of the capacitor Cst adjacent to the first scan line SLn is separated from the second electrode Cst2, and the separated second region 142 is coupled to the first scan line SLn.

For example, the first bridge 144 coupling the first region 141 and the second region 142 of the second electrode Cst2 of the capacitor Cst and the second connecting parts 152 coupled to the second regions 142 of the pixels Pn,m−1 and Pn,m+1 that are horizontally adjacent to the first pixel Pn,m are cut by irradiating a laser thereto. Furthermore, a laser is irradiated to the first protrusion 161 and the second protrusion 162 of the second electrode Cst2 positioned at left and right sides of an open-circuit region of the first scan line SLn so that the first protrusion 161 and the second protrusion 162 are short-circuited and coupled to the first scan line SLn.

Accordingly, the second region 142 of the second electrode Cst2 of the capacitor Cst may serve as a path (e.g., an electrical path) through which the first scan line SLn transfers the first scan signal Sn normally. The first region 141 and the third region 143 may serve as the second electrode Cst2 of the capacitor Cst and the driving voltage line PL for horizontally transferring the first power supply voltage ELVDD.

According to an embodiment of the present invention, the second electrode Cst2 may serve as both an electrode of the capacitor Cst and the driving voltage line PL, and may also serve as a repair line of the first scan line SLn when a defect such as, but not limited to, an open circuit occurs.

Figure 12:
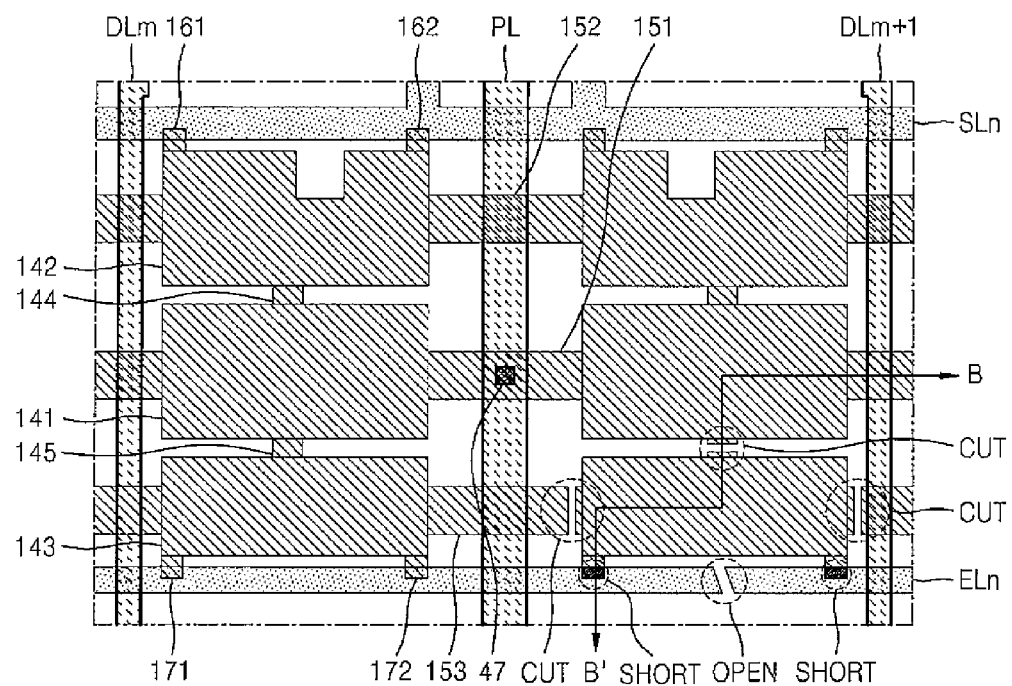
FIG. 12 is a schematic diagram illustrating a method of repairing an open-circuited light-emission control line on the thin-film transistor substrate of FIG. 10.
Figure 13:
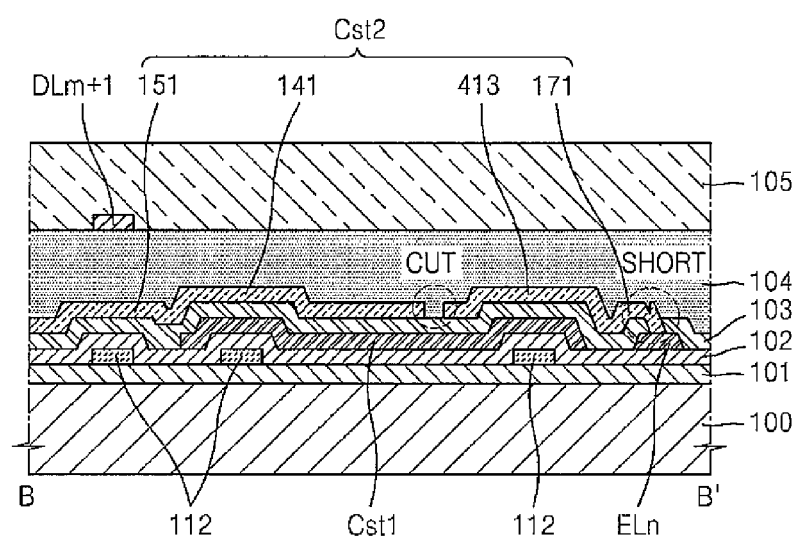
FIG. 13 is a cross-sectional view of the thin-film transistor substrate taken along the line B-B' of FIG. 12.

FIG. 12 is a schematic diagram illustrating a method of repairing an open-circuited light-emission control line on the thin-film transistor substrate of FIG. 2. FIG. 13 is a cross-sectional view of the thin-film transistor substrate taken along the line B-B' of FIG. 12.

FIG. 12 only illustrates the second electrode Cst2 of the capacitor Cst for convenience of explanation, and FIG. 13 illustrates a cross section of the thin-film transistor substrate taken along the line B-B' of FIG. 12.

Referring to FIG. 12, when the light-emission control line ELn is open-circuited, the second bridge 145 coupling the first region 141 and the third region 143 of the second electrode Cst2 of the capacitor Cst and the left and right connecting parts 153 are cut. The third and fourth protrusions 171 and 172 overlapping the light-emission control line ELn are short-circuited and coupled to the light-emission control line ELn.

Referring to FIGS. 12 and 13 together, when the light-emission control line ELn arranged in the second pixel Pn,m+1 is open-circuited, the third region 143 of the second electrode Cst2 of the capacitor Cst adjacent to the light-emission control line ELn is separated from the second electrode Cst2, and the separated third region 143 is coupled to the light-emission control line ELn.

For example, the second bridge 145 coupling the third region 143 and the first region 141 of the second electrode Cst2 and the third connecting parts 153 coupled to the third regions 143 of pixels that are horizontally adjacent to the second pixel Pn,m−1 are cut by irradiating a laser thereto. Furthermore, a laser is irradiated to the third protrusion 171 and the fourth protrusion 172 of the second electrode Cst2 positioned at left and right sides of an open-circuit region of the light-emission control line ELn so that the third protrusion 171 and the fourth protrusion 172 are short-circuited and coupled to the light-emission control line ELn.

According to an embodiment of the present invention, the second electrode Cst2 may serve as both an electrode of the capacitor Cst and the driving voltage line PL, and may also serve as a repair line of the light-emission control line ELn when a defect such as, but not limited to, an open circuit occurs.

Although not illustrated, the via hole VIA is formed at the protective layer 105. The anode (pixel electrode) of the OLED is formed on the protective layer 105, covering the via hole VIA.

A pixel defining layer is formed on an edge of the pixel electrode and the protective layer 105, wherein the pixel defining layer has a pixel opening that exposes the pixel electrode. The pixel defining layer may be formed of an organic material such as, but not limited to, a polyacrylic resin and polyimide or a silica-based inorganic material. An organic light-emitting layer is formed on the pixel electrode exposed by the pixel opening, and a cathode electrode (common electrode) is formed on the organic light-emitting layer on a front side of the substrate 100. In this manner, the OLED including the pixel electrode, the organic light-emitting layer, and the common electrode is formed. Here, according to a method of driving the organic light-emitting display apparatus, the pixel electrode may be the cathode and the common electrode may be the anode.

Although FIGS. 10 and 11 and FIGS. 12 and 13 respectively illustrate the methods of repairing open circuits of the first scan line SLn and the light-emission control line ELn, embodiments of the present invention are not limited thereto. For example, when both the first scan line SLn and the light-emission control line ELn are open-circuited in one pixel, only the first region 141 may serve as the second electrode Cst2 and the driving voltage line PL, and the second region 142 and the third region 143 may be used to repair the first scan line SLn and the light-emission control line ELn respectively.

Although the above-described organic light-emitting display apparatus has seven thin-film transistors and one capacitor in a pixel, an embodiment of the present invention is not limited thereto. Therefore, the display apparatus may have a plurality of thin-film transistors and one or more capacitors in one pixel. Furthermore, additional wiring may be formed or existing wiring may be omitted in the display apparatus.

Embodiments of the present invention are not limited to using a single pixel to repair an open circuit in a signal line. It would be understood by one of ordinary skill in the art that when an open circuit region occurs between two pixels, the second electrode Cst2 of the capacitor Cst of each pixel can serve as a path (e.g., an electrical path) through which the signal line can transfer the signal normally.

As described above, according to the one or more of the above embodiments of the present invention, a signal line may be repaired without an additional repair line, and a spatial restriction of a high-resolution display apparatus may be overcome.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and their equivalents.

What is claimed is:

1. A thin-film transistor substrate comprising:
    a first signal line;
    a second signal line; and
    a capacitor comprising a first electrode and a second electrode,
    wherein the second electrode comprises a plurality of divided regions, a plurality of bridges for coupling the plurality of divided regions to each other, and a plurality of protrusions each overlapping at least one of the first signal line or the second signal line, and
    wherein each of the plurality of divided regions is coupled to a corresponding divided region of a horizontally adjacent pixel.

2. The thin-film transistor substrate of claim 1, wherein the divided regions comprise a first region, a second region which is adjacent to the first signal line and is coupleable to the first region by a first bridge of the bridges, and a third region which is adjacent to the second signal line and is coupleable to the first region by a second bridge of the bridges.

3. The thin-film transistor substrate of claim 2, wherein the first signal line is open-circuited at an open circuit region of the first signal line, the first bridge is cut so that the second region is separated from the second electrode, and protrusions of the plurality of protrusions, which overlap the first signal line, are coupled to the first signal line at a left side and a right side of the open circuit region.

4. The thin-film transistor substrate of claim 2, wherein the second signal line is open-circuited at an open circuit region of the second signal line, the second bridge is cut so that the third region is separated from the second electrode, and protrusions of the plurality of protrusions, which overlap the second signal line, are coupled to the second signal line at a left side and a right side of the open circuit region.

5. The thin-film transistor substrate of claim 2, wherein the second electrode comprises a first connecting part adapted to couple the first region with a corresponding first region of the horizontally adjacent pixel, a second connecting part adapted to couple the second region with a corresponding second region of the horizontally adjacent pixel, and a third connecting part adapted to couple the third region with a corresponding third region of the horizontally adjacent pixel.

6. The thin-film transistor substrate of claim 5, wherein the first signal line is open-circuited at an open circuit region of the first signal line, the first bridge and the first connecting part are cut so that the second region is separated from the second electrode, and protrusions of the plurality of protrusions, which overlap the first signal line, are coupled to the first signal line at a left side and a right side of the open circuit region.

7. The thin-film transistor substrate of claim 5, wherein the second signal line is open-circuited at an open circuit region of the second signal line, the second bridge and the third connecting part are cut so that the third region is separated from the second electrode, and protrusions of the plurality of protrusions, which overlap the second signal line, are coupled to the second signal line at a left side and a right side of the open circuit region.

8. The thin-film transistor substrate of claim 1, wherein the first signal line and the second signal line and the plurality of protrusions are insulated by an insulating layer disposed therebetween.

9. The thin-film transistor substrate of claim 1, wherein the second electrode is coupled to a driving voltage line.

10. The thin-film transistor substrate of claim 9, wherein the driving voltage line is shared by two adjacent pixels.

11. The thin-film transistor substrate of claim 1, further comprising a driving thin-film transistor arranged to be perpendicular to the capacitor and comprising the first electrode as a gate electrode and a bent active layer.

12. The thin-film transistor substrate of claim 1, wherein the first signal line is a scan line for applying a scan signal.

13. The thin-film transistor substrate of claim 1, wherein the second signal line is a light-emission control line for applying a light-emission control signal.

14. A thin-film transistor substrate comprising:
    a signal line comprising an open circuit region; and
    a capacitor comprising a first electrode and a second electrode,
    wherein the second electrode comprises a first region and a second region which is adjacent to the signal line and is coupleable to the first region by a first bridge,
    wherein the first bridge is cut so that the second region is separated from the second electrode, and protrusions of a plurality of protrusions of the second electrode, which overlap the signal line, are coupled to the signal line at a left side and a right side of the open circuit region, and
    wherein the first region is coupled to a corresponding first region of a horizontally adjacent pixel.

15. The thin-film transistor substrate of claim 14, wherein the signal line is a scan line for applying a scan signal.

16. The thin-film transistor substrate of claim 14, wherein the signal line is a light-emission control line for applying a light-emission control signal.

17. The thin-film transistor substrate of claim 14, wherein the second electrode is coupled to a driving voltage line.

18. The thin-film transistor substrate of claim 17, wherein the driving voltage line is shared by two adjacent pixels.

19. The thin-film transistor substrate of claim 14, further comprising a driving thin-film transistor arranged to be perpendicular to the capacitor and comprising the first electrode as a gate electrode and a bent active layer.

20. A method of repairing an open-circuited signal line on a thin-film transistor substrate with a capacitor comprising a first electrode and a second electrode with the second electrode comprising a plurality of divided regions each coupled to a corresponding divided region of a horizontally adjacent pixel, a plurality of bridges coupling the plurality of divided regions to each other, and a plurality of protrusions which overlap signal lines, the method comprising:
  separating a first divided region of the divided regions from the second electrode by cutting a first bridge of the bridges, the first bridge coupling the first divided region, which is adjacent to the open-circuited signal line, to other ones of the divided regions; and
  coupling the open-circuited signal line to protrusions of the plurality of protrusions, which overlap the open-circuited signal line, at a left side and a right side of an open circuit region of the open-circuited signal line.

* * * * *